United States Patent [19]

Leibovitz

[11] Patent Number: 5,011,819
[45] Date of Patent: Apr. 30, 1991

[54] PROCESS USING SUPERCRITICAL CONDITIONS FOR PRODUCING HIGHLY ACCURATE AND HOMOGENEOUS POWDER MIXTURE USEFUL IN FABRICATION OF HIGH QUALITY CERAMIC SUPERCONDUCTORS

[75] Inventor: Jacques Leibovitz, San Jose, Calif.

[73] Assignee: Hewlett-Packard Company, Palo Alto, Calif.

[21] Appl. No.: 201,706

[22] Filed: Jun. 2, 1988

[51] Int. Cl.$^5$ .................. B01D 3/06; H01L 39/12
[52] U.S. Cl. ..................... 505/1; 23/293 R; 156/621; 203/49; 423/592; 505/734
[58] Field of Search ............... 23/293 R; 156/623 R, 156/621; 423/592, 556; 75/0.5 A; 203/49; 505/1, 734

[56] References Cited

U.S. PATENT DOCUMENTS

| | | | |
|---|---|---|---|
| 2,215,183 | 9/1940 | Lawrence et al. | 423/556 |
| 3,440,025 | 4/1969 | Laudise et al. | 156/623 |
| 4,072,501 | 2/1978 | Quinby | 75/0.5 A |
| 4,579,622 | 4/1986 | Caporaso et al. | 156/623 R |
| 4,714,526 | 12/1987 | Pennisi et al. | 203/49 |
| 4,731,153 | 3/1988 | Hirano et al. | 156/621 |
| 4,778,671 | 10/1988 | Wusirika | 423/592 |
| 4,808,216 | 2/1989 | Kageyama et al. | 75/0.5 A |
| 4,906,329 | 3/1990 | Tominari et al. | 203/49 |

OTHER PUBLICATIONS

Johnson et al., Adv. Ceram. Materials, 2(3B), Special Issue, 1987, p. 357.
Novotny, Kristall u. Technik, vol. 6, (1971), p. 343.
Hirano et al., Jour. Crystal Growth, 85, (1987), 602.
Fujiki et al., Jap. Jour. Appl. Physics, 26, (Jul. 1987), L-1159.
Voigt et al., (eds) Brodsky et al., M.R.S. Symp. Proc., #99, MRS, Pittsburgh, 1987, p. 635.

Primary Examiner—Upendra Roy

[57] ABSTRACT

A process is disclosed for the formation of a uniform and homogeneous mixture of a plurality of compounds in a desired stoichiometric ratio as a precipitate from a fluid under supercritical processing conditions which comprises dissolving at a first supercritical temperature a stoichiometric mixture of compounds in a fluid in a closed reaction vessel having a fixed first volume and rapidly expanding the volume in which the fluid is confined to lower the density sufficiently to cause the stoichiometric mixture of compounds to precipitate as a unifrom and stoichiometrically accurate mixture of the compounds, preferably without changing the phase of the fluid. The process may be used to form a high quality superconductor material because of the uniform and homogeneous distribution of the precipitated components in a stoichiometrically accurate ratio throughout said mixture.

11 Claims, 2 Drawing Sheets

```
┌─────────────────────────────────┐
│   FORMING A STOICHIOMETRIC      │
│   MIXTURE OF COMPOUNDS IN A     │
│   RATIO OF 1 MOLE OF RARE EARTH │
│   PER 2 MOLES OF ALKALINE EARTH │
│   METAL AND 3 MOLES OF COPPER   │
└─────────────────────────────────┘
                 │
┌─────────────────────────────────┐
│   DISSOLVING THE MIXTURE IN A   │
│   FLUID IN A REACTION VESSEL OF │
│   FIXED VOLUME AND PRESSURE AT  │
│   A SUPERCRITICAL TEMPERATURE   │
└─────────────────────────────────┘
                 │
┌─────────────────────────────────┐
│   RAPIDLY EXPANDING THE VOLUME  │
│   TO LOWER THE DENSITY OF THE   │
│   FLUID TO PRECIPITATE A        │
│   STOICHIOMETRICALLY HOMOGENEOUS│
│   MIXTURE PREFERABLY WITHOUT    │
│   CHANGING THE PHASE OF THE FLUID│
└─────────────────────────────────┘
                 │
┌─────────────────────────────────┐
│   RECOVERING A HIGHLY UNIFORM   │
│   AND STOICHIOMETRICALLY        │
│   ACCURATE MIXTURE SUITABLE     │
│   FOR USE IN FORMING            │
│   HIGH QUALITY SUPERCONDUCTORS  │
└─────────────────────────────────┘
```

FIG. 1

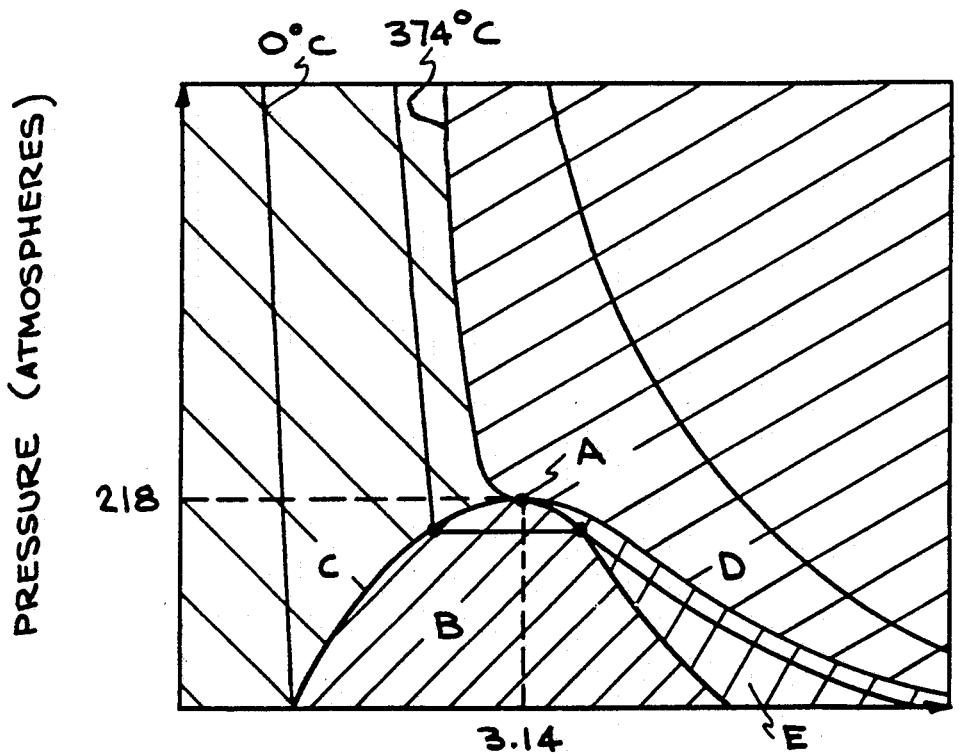
WATER CHART: P-V-T RELATIONSHIPS FIG. 2
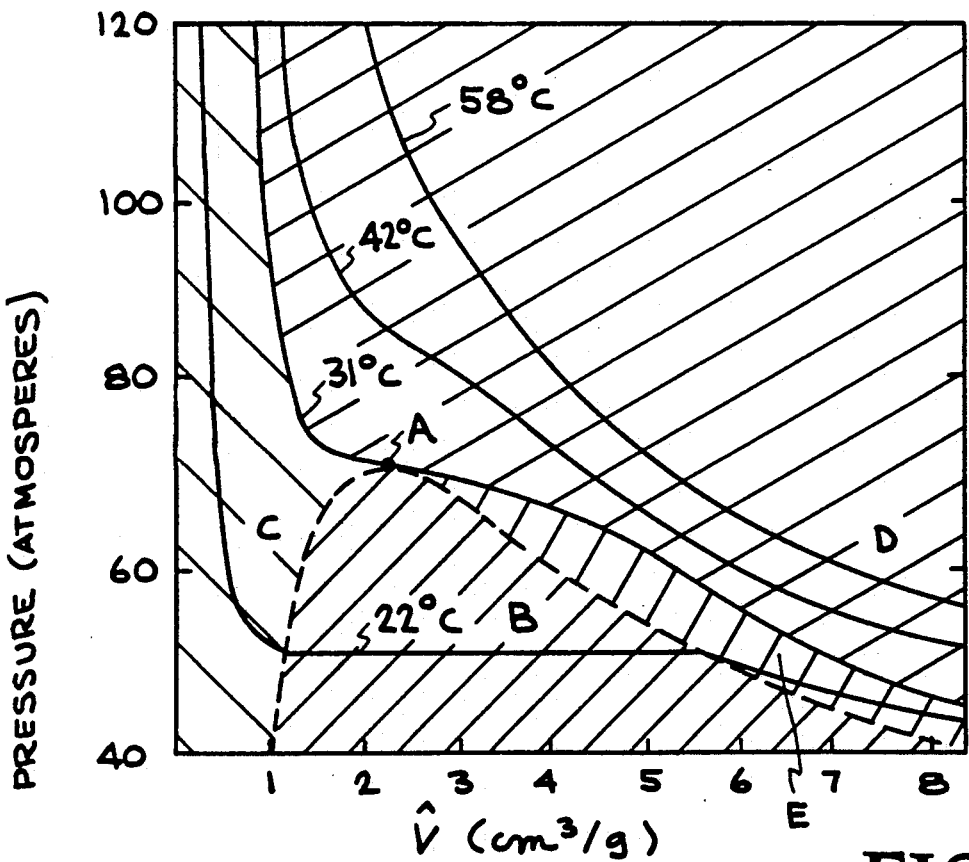
$CO_2$ CHART: P-V-T RELATIONSHIPS FIG. 3

PROCESS USING SUPERCRITICAL CONDITIONS FOR PRODUCING HIGHLY ACCURATE AND HOMOGENEOUS POWDER MIXTURE USEFUL IN FABRICATION OF HIGH QUALITY CERAMIC SUPERCONDUCTORS

BACKGROUND OF THE INVENTION

1. Field of the Invention

This invention relates to the production of a highly accurate and very uniformly distributed mixture of compounds suitable for use in a superconductor. More particularly, this invention relates to the production of a highly accurate and very uniformly distributed mixture of compounds formed by precipitating the mixture from a solution by varying its density, preferably without phase change of the solvent.

2. Description of the Related Art

Since the discovery of superconductivity in 1911, the phenomena of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomena at much higher temperatures, e.g., in some cases even higher than the boiling point of liquid nitrogen which boils at about 77° K. The ability to produce superconductivity, for example, in a material cooled by liquid nitrogen completely changes the economics which have previously restricted the applications to which superconductivity could be applied.

These new ceramic materials are sometimes referred to as triple-layer perovskite compounds because of the crystallography of the resulting structure; or 1-2-3 compounds because of the atomic ratios of 1 atom of a first element such as, for example, a rare-earth (Lanthanum series) element such as lanthanum or yttrium, 2 atoms of one or more alkaline earth metals such as barium, calcium, or strontium, and 3 atoms of copper. The superconducting ceramic also contains from 6.5+ to 7- atoms of oxygen which may be referred to as $O_{(6.5+X)}$ where X is greater than 0 and less than 0.5, resulting in a chemical formula such as, for example, $YBa_2Cu_3O_{(6.5+X)}$.

The prevalent method used to produce this type of superconducting ceramic is to mechanically mix powders of the oxides or carbonates for example, of the respective rare earth, alkaline earth metal, and copper elements in the 1-2-3 structure of the superconductor, calcine the mixture to remove water and/or other volatiles, and then fire the powder mixture in an oxygen atmosphere at a temperature sufficiently high to produce the desired superconducting phase.

However, the mixing process, usually in a ball mill, takes many hours, and sometimes introduces impurities from the balls or the ball milling vessel.

The inadequacies of such a mixing process is evidenced by the variations in compositions of the resulting fired ceramic material, and consequently, variations in properties. If the mixture composition is not accurate, and/or the sintering temperature is too high, the superconductor apparently becomes distributed as small islands embedded in a non-superconducting material.

It is, therefore, apparent that to reproducibly make superconducting material from a mixture of materials, such as the mixture of compounds used in forming such 1-2-3 superconductors, the powdered mixture prepared for sintering must be of the highest purity, i.e., be formed from high purity materials and have minimal contamination introduced through the mixing process, and the powdered mixture must have the respective reactants accurately and uniformly distributed throughout the powdered mixture to the greatest degree possible.

The desire to achieve such purity and uniformity of mixture have lead to attempts to replace the ball milling form of mixing by precipitation of the powdered mixture from a solution. However, these attempts have met with difficulties because of the very large differences in solubility of the different ingredients at the processing conditions employed in such precipitation processes, resulting in non-uniform precipitation of the various compounds needed in the mixture to form the superconductor.

It would, therefore, be desirable to provide a more satisfactory method of forming the desired uniform and stoichiometrically accurate mixture of high purity reactants used in forming the superconducting material.

SUMMARY OF THE INVENTION

It is, therefore, an object of this invention to provide a process for forming a uniform and stoichiometrically accurate mixture of high purity materials suitable for use in forming a superconductor material upon subsequent sintering of the mixture by dissolving a stoichiometric mixture of such pure materials in a suitable fluid and then precipitating a uniform and stoichiometrically accurate mixture of such materials in high purity form by the sudden decrease in solubility for all the solutes caused by a sudden decrease in the density of the solution.

It is another object of this invention to provide a process for forming a uniform and stoichiometrically accurate mixture of high purity materials suitable for use in forming a superconductor material upon subsequent sintering of the mixture by dissolving a stoichiometric mixture of such materials in a suitable fluid at a first pressure and supercritical temperature above the critical temperature of the solution and then lowering the density of the solution by rapidly expanding the volume to thereby decrease the solubility of the dissolved materials in the fluid solvent to cause precipitation of a uniform and stoichiometrically accurate mixture of such materials in high purity form from the fluid without a phase change in the fluid. The rapid expansion is accompanied by an adiabatic decrease in temperature.

It is yet another object of this invention to provide a process for forming a uniform and stoichiometrically accurate mixture of high purity materials suitable for use in forming a superconductor material upon subsequent sintering of the mixture by dissolving a stoichiometric mixture of such materials in a suitable fluid at a first pressure and supercritical temperature and then lowering the density of the solution by rapidly expanding the volume to thereby decrease the solubility of the dissolved materials in the fluid solvent to cause precipitation of a uniform and stoichiometrically accurate mixture of such materials in high purity form from the fluid without a change in phase of the fluid, wherein the first pressure and supercritical temperature are selected such that upon the rapid volume expansion, the temperature is lowered to a second supercritical temperature.

It is a further object of this invention to provide a process for forming a uniform and stoichiometrically accurate mixture of high purity materials suitable for use in forming a superconductor material upon subsequent sintering of the mixture by dissolving a stoichiometric mixture of such materials in a suitable fluid at a first pressure and supercritical temperature of the solution and then lowering the density of the solution by rapidly expanding the volume to thereby decrease the solubility of the dissolved materials in the fluid solvent to cause precipitation of a uniform and stoichiometrically accurate mixture of such materials in high purity form from the fluid without a change in phase of the fluid at the volume to which the fluid has been expanded, wherein the first pressure and supercritical temperature are selected such that upon the rapid volume expansion, the temperature is lowered to a second temperature which is not necessarily above the supercritical temperature.

It is yet a further object of this invention to provide a process for forming a uniform and stoichiometrically accurate mixture of high purity materials suitable for use in forming a superconductor material upon subsequent sintering of the mixture by dissolving a stoichiometric mixture of such materials in a suitable fluid at a first pressure and supercritical temperature of the solution and then lowering the density of the solution by rapidly expanding the volume to thereby decrease the solubility of the dissolved materials in the fluid solvent to cause precipitation of a uniform and stoichiometrically accurate mixture of such materials in high purity form from the fluid, which precipitation, if there is a phase change, does not occur until after the phase change is complete and wherein the first pressure and supercritical temperature are selected such that upon the rapid volume expansion, the temperature is lowered to a second temperature which is below the supercritical temperature.

BRIEF DESCRIPTION OF THE DRAWINGS

FIG. 1 is a flow sheet illustrating the process of the invention.

FIG. 2 is a graph showing the isotherms for water at various supercritical and subcritical temperatures.

FIG. 3 is a graph showing the isotherms for $CO_2$ at various supercritical and subcritical temperatures.

DETAILED DESCRIPTION OF THE INVENTION

In accordance with the invention, a highly uniform, pure, and stoichiometrically accurate mixture of several compounds previously dissolved in a fluid solvent is precipitated from the fluid under supercritical processing conditions by first dissolving a stoichiometric mixture of the compounds at a first high pressure and density, and supercritical temperature and then lowering the density by a rapid volume expansion to a second density of the fluid to thereby lower the solubility of the compounds in the fluid causing precipitation of a mixture of the compounds, preferably without, however, a phase change in the fluid.

By use of the expression "stoichiometrically accurate" is meant that two or more compounds initially dissolved in the fluid in some predetermined ratio are made to subsequently and reproducibly precipitate in a desired stoichiometric ratio, thus preserving the accuracy of the desired stoichiometric ratio. In one embodiment, the compounds are initially dissolved in a stoichiometric ratio in a fluid and then are precipitated in the same stoichiometric ratio.

By use of the terms "quick" or "rapid" to describe the expansion of the volume is meant an expansion which may approach the speed of sound, but which will not exceed one second in time.

It should be noted that in the preferred embodiment, the process of the invention does not involve a "flashing" of the fluid as this term is limited to subcritical processing and usually involves a phase change. However, as will be explained in more detail below, the process could involve a flashing which includes a phase change in the limited instance where such a phase change was completed before commencement of the precipitation.

The fluid used to dissolve the stoichiometric mixture of compounds must be a fluid of high purity which does not introduce impurities into the mixture. Examples of fluids which may be used for this purpose in the process of the invention include $H_2O$, $CO_2$, $NO_2$, or $NH_3$, or mixtures of such fluids. Other fluid materials which are not, by themselves in a fluid condition under the pressure/temperature conditions used, may also be mixed with such a fluid. For example, ethylenediaminetetracetic acid (EDTA), which by itself is a solid, can be mixed with one of the aforementioned fluids and will act to increase the solubility of the salts in the fluid mixture. By "high purity" is meant a purity of at least 99.8 wt.%, with respect to non-volatile materials. The presence of volatile materials, for example, such as $O_2$ or $N_2$ in the solvent will not affect the purity of the precipitate since these materials will not remain in either the fluid or the precipitate. Thus it will be understood that the figure of 99.8 wt.% purity does not include the presence or absence of such volatile materials.

The mixture of compounds is initially dissolved in the fluid in a stoichiometric ratio equivalent to the desired stoichiometry of the precipitated mixture. The total amount of compounds initially dissolved in the fluid is based on the solubility of the least soluble compound at the desired starting temperature. This may be determined empirically and then an amount slightly less may be actually dissolved to ensure complete solubility of the initial mixture of compounds.

For example, after determining first of all which of the compounds in the stoichiometric mixture is the least soluble in the particular fluid selected for use, and then determining the amount of this least soluble compound in the stoichiometric mixture needed to saturate the fluid at the desired starting temperature; an amount of the stoichiometric mixture containing from about 1-25 wt.%, preferably about 5-15 wt.%, less than such saturation amount of this least soluble compound will be added to ensure against premature precipitation.

When, for example, it is desired to produce a yttrium-barium-copper-oxide superconductor having two moles of barium and three moles of copper per mole of yttrium; in accordance with the invention, a precipitate having such stoichiometric amounts of the three elements uniformly and stoichiometrically accurately dispersed or mixed therein will be formed from a solution in which compounds containing these three elements will have been dissolved in the desired stoichiometric ratios, with the least soluble compound being used as the upper limit.

If, for example, these three elements were mixed and dissolved as oxides in water, the least soluble oxide would be copper oxide (CuO), with yttrium oxide ($Y_2O_3$) and barium oxide (BaO) being more soluble in water.

The actual solubility of the copper oxide at the desired supercritical temperature would then be determined and the amount of the other oxides would be adjusted accordingly to maintain the desired stoichiometry while providing from 1-25 wt.% less copper oxide than the saturation amount.

The use of the oxides of yttrium, barium, and copper are by way of illustration only, it will be understood. When making, for example, such 1-2-3 superconductors may other compounds may be used including, for example, those nitrate, sulfate, halide, carbonate, or organic salts or oxides of one or more rare earths, one or more alkaline earth metals, and copper. These including such rare earths as scandium, yttrium, and any of the lanthanide series of rare earths, including lanthanum, neodymium, promethium, samarium, europium, gadolinium, terbium, dysprosium, holmium, erbium, thulium, ytterbium, and lutetium; with the possible exceptions of cerium and praseodymium which have not, to date, been successfully used in forming such superconducting ceramics; and alkaline earth metals such as calcium, barium, and strontium.

However, of course, the particular compounds used must be capable of dissolving in the particular fluid selected and must include elements which will react with the other reactants in the presence of oxygen to form the desired superconducting ceramic, when formation of such is the desired end use of the uniform and stoichiometrically accurate precipitate.

Furthermore, the particular anion used with the rare earth salt, alkaline earth metal salt, or copper salt, in forming the solution in the fluid must not be one which will, in the solvent used, react with any of the other cations to form an insoluble precipitate. For example, the anion in the particular alkaline earth metal salt dissolved in the fluid solvent must not be one which would react with the dissolved copper or the particular rare earth being used to form a precipitate. Thus, while it is not necessary, it is desirable that all of the salts used comprise the same anion, as the above problem can always be avoided by such a practice.

The pressure in the reaction vessel at which the initial dissolution takes place may vary from a minimum, for example, of 10 atmospheres in the case of $CO_2$ at subcritical conditions up to as high as 300 atmospheres in the case of $H_2O$ at supercritical conditions. It will be understood that the limits may vary with the particular fluid used in the process.

The solution comprising the stoichiometric mixture of compounds dissolved in the fluid is formed in a reaction vessel which is nonreactive with the materials used therein and which is capable of withstanding pressures used in the process for the particular fluid, i.e., usually from about 10 up to about 300 atmospheres, as the temperature is raised. Furthermore the reaction vessel must be provided with means to permit very rapid expansion of the fluid solution therein to a larger volume. This may, for example, comprise a very fast acting valve connecting the reaction vessel to a second vessel.

It should be noted in this regard that it is important that the volume expansion be carried out as rapidly as possible to ensure the formation of many fine particles by offering many nucleation sites rather than the formation of larger particles which may result in less uniformity of the precipitate. Thus, it is advisable that the additional volume, e.g., the second vessel, be evacuated if possible, to provide the least resistance to the rapid expansion of the fluid into the additional volume.

For the same reasons, in the preferred embodiment, it is important that the initial temperature be high enough so that the expansion of volume and resulting lowering of the density does not result in a phase change of the fluid as a phase change, i.e., the change from vapor to a liquid, will absorb much more heat and therefore unduly slow the process down, thereby jeopardizing the desired uniformity and stoichiometrically accuracy of the precipitation mixture.

Referring to the graphs of FIGS. 2 and 3 which, by way of example, respectively, show the isotherms for water and $CO_2$, it will be noted that point A in each graph marks the critical point on the critical temperature isotherm wherein the respective fluid changes phases from a vapor to a liquid without any intermediate range where both vapor and liquid are present.

In each of the two graphs, the shaded area indicated as area B below point A represents the temperature, pressure, and volume conditions at which a mixture of both phases will be simultaneously present. The area to the left of the shaded area and beneath the critical temperature curve, i.e., at subcritical temperatures, indicated as area C, represents the region in which only the liquid phase will be present. The area above the critical temperature curve, shown as area D, and the area to the right of shaded area B below the critical temperature, shown as area E, both represent conditions at which only the vapor phase will be present.

Thus, in the preferred embodiment of the process of the invention, the precipitation should occur only when the pressure/temperature/volume conditions lie in either area D or area E. Naturally, of course, should the process conditions only slip very slightly into region B, e.g., 1°-4° C., the resultant non-uniformity of the precipitate may be too slight to be detectable.

It should be noted that while, in the preferred embodiment, the lowering of the density, by rapid expansion of the volume, results in a precipitation of the stoichiometric mixture of salts or oxides without a phase change in the fluid, it may be possible, in limited instances, to carry out the process of the invention despite a phase change. In such an instance, the process conditions could dip into area B during the lowering of the density. However, even in such an instance, it is important that the precipitation not occur during the time that the temperature/pressure/volume conditions are in area B, since the presence of more than one phase in the fluid during precipitation will result in a non-uniform precipitation and thus defeat the formation of a homogeneous stoichiometric precipitate. Thus, the precipitation should occur after the process conditions have passed through area B.

Thus, for example, when $H_2O$ is selected as the fluid in which the stoichiometric ratio of compounds is to be dissolved, the solution may be heated to a first supercritical temperature of 460° C. and the volume in which the fluid is confined at a pressure of from 75 to 240 atmospheres may then be rapidly expanded with the temperature correspondingly dropping to 410° C. which is still above the critical temperature, i.e., within area D; or the temperature may be dropped further to a temperature below the critical temperature if the pressure and volume at that point fall within area E on the graph, i.e., to the right of areas B and C.

In accordance with the preferred embodiment of the process of the invention, the stoichiometric mixture of compounds is dissolved in the fluid in the reaction vessel at a first temperature above the critical temperature. When the density of the solution is lowered by the rapid expansion of volume, the temperature of the fluid is also lowered, to a second temperature which is either also above the critical temperature, i.e., in region D, or is at a temperature below the critical temperature but in region E to the right of shaded region B of the graph representing no phase change.

By dissolving in the fluid at a high density and at a first elevated temperature above the critical temperature, an amount of the stoichiometric mixture only slightly less than the saturation amount (at that temperature and density) of the least soluble component of the mixture, rapid lowering of the density of the fluid through rapid expansion of the volume results in a rapid precipitation of the dissolved compounds.

When this rapid volume expansion is carried out without permitting the fluid conditions to enter the shaded region or the region to the left of the shaded region, representing a phase change, a rapid precipitation will occur. This, in turn, permits the uniform, homogeneous, and simultaneous formation of fine crystals, in the desired stoichiometric ratio, of all of the compounds dissolved in the fluid, as opposed to a slower precipitation in which precipitation of one of the compounds might be favored over precipitation of another compound which could result in a non-uniform and possibly non-stoichiometric precipitate.

It should be noted that reduction of the temperature from a supercritical temperature down to a temperature which is below the critical temperature isotherm, but in the region where the fluid occurs only in its vapor state, may be controlled by empirically determining, under the pressure and volume conditions used, that no phase change of the fluid is actually occurring. Presuming that the reactor vessel volume, and the expansion volume are fixed, the pressure can be adjusted to ensure that the volume expansion to achieve the desired lowering of the density of the fluid, and resultant temperature drop, do not result in a phase change in the fluid.

Alternatively, of course, this can be completely avoided by always lowering the temperature from a first supercritical temperature to a lower temperature which is also above the critical temperature, i.e., by further limiting the amount of the volume expansion.

Thus, the process of the invention provides for the formation of a uniform and homogeneous mixture of a plurality of compounds in a desired stoichiometric ratio as a precipitate from a fluid under supercritical processing conditions wherein the stoichiometric mixture of compounds is initially added to a fluid in an amount which will permit total dissolution in the fluid at a first density and supercritical temperature and the density of the fluid is then lowered by a rapid expansion of the volume, preferably without changing the phase of the fluid, to provide a rapid precipitation of the dissolved mixture in the desired stoichiometry and as a uniform and homogeneous mixture whereby the product may be used in forming a high quality superconductor therefrom if desired.

Having thus described the invention, what is claimed is:

1. A process for forming a uniform and homogeneous mixture of a plurality of ceramic precursor compounds in a desired stoichiometric ratio as a precipitate from a fluid under supercritical processing conditions, the process comprising:
   (a) dissolving a stoichiometric mixture of compounds in a fluid confined in a fixed first volume at a first density and supercritical temperature, the mixture of compounds containing from 1 to 25 weight per cent less than the saturation amount of the least soluble compound in the fluid at said first density and supercritical temperature; and
   (b) rapidly expanding the volume in which said fluid is confined to a second fixed volume without changing the phase of the fluid, thereby lowering the density of the fluid and causing said stoichiometric mixture of compounds to precipitate as a uniform and stoichiometrically accurate mixture of said compounds;
   wherein said stoichiometric mixture of compounds, when subsequently heated in the presence of oxygen, will form a high quality superconductor material because of the uniform and homogeneous distribution of the precipitated components in a stoichiometrically accurate ratio throughout the mixture.

2. A process for forming a uniform and homogeneous mixture of a plurality of ceramic precursor compounds in a desired stoichiometric ratio as a precipitate from a fluid under supercritical processing conditions, the process comprising:
   (a) dissolving a stoichiometric mixture of compounds in a fluid confined in a fixed first volume at a first density and supercritical temperature, the fluid selected from among $H_2O$, $CO_2$, $NO_2$, and $NH_3$, the mixture of compounds containing from 1 to 25 weight per cent less than the saturation amount of the least soluble compound in the fluid at said first density and supercritical temperature; and
   (b) rapidly expanding the volume in which said fluid is confined to a second fixed volume without changing the phase of the fluid, thereby lowering the density of the fluid and causing said stoichiometric mixture of compounds to precipitate as a uniform and stoichiometrically accurate mixture of said compounds;
   whereby said stoichiometric mixture of compounds, when subsequently heated in the presence of oxygen, will form a high quality superconductor material because of the uniform and homogeneous distribution of the precipitated components in a stoichiometrically accurate ratio throughout the mixture.

3. The process of claim 2 including the further step of initially mixing together a stoichiometric mixture of compounds containing a ratio of compounds respectively containing one mole of one or more of a first element, two moles of one or more alkaline earth metals, and three moles of copper to form a superconductor upon subsequent heating in the presence of oxygen.

4. The process of claim 3 wherein said first element is selected from the class consisting of one or more rare earths, thallium, and mixtures thereof.

5. The process of claim 3 wherein said first element is one or more rare earths selected from the class consisting of scandium, yttrium, lanthanum, neodymium, promethium, samarium, europium, gadolinium, terbium, dysprosium, holmium, erbium, thulium, ytterbium, and lutetium.

6. The process of claim 3 wherein said alkaline earth metal is selected from the class consisting of calcium, barium, strontium, and mixtures thereof.

7. The process of claim 3 wherein said stoichiometric mixture comprises compounds containing respectively one mole of yttrium, two moles of barium, and three moles of copper.

8. A process for forming a uniform and homogeneous mixture of a plurality of ceramic precursor compounds in a desired stoichiometric ratio as a precipitate from a fluid under supercritical processing conditions, the process comprising:

(a) forming a stoichiometric mixture of compounds containing, respectively, a mole ratio of:
(1) one mole of a first element selected from the class consisting of one or more rare earths, thallium, and mixtures thereof;
(2) two moles of one or more alkaline earth metals; and
(3) three moles of copper;

(b) dissolving a stoichiometric mixture of compounds in a fluid confined in a fixed first volume at a first density and supercritical temperature, the fluid selected from among $H_2O$, $CO_2$, $NO_2$, and $NH_3$, the mixture of compounds containing from 1 to 25 weight per cent less than the saturation amount of the least soluble compound in the fluid at said first density and supercritical temperature; and (c) rapidly expanding the volume in which said fluid is confined to a second fixed volume without changing the phase of the fluid, thereby lowering the density of the fluid and causing said stoichiometric mixture of compounds to precipitate as a uniform and stoichiometrically accurate mixture of said compounds;

whereby said stoichiometric mixture of compounds, when subsequently heated in the presence of oxygen, will form a high quality superconductor material because of the uniform and homogeneous distribution of the precipitated components in a stoichiometrically accurate ratio throughout the mixture.

9. The process of claim 8 wherein said step of expanding said volume further comprises expanding said volume sufficiently to lower the density to cause said uniform and homogeneous precipitation without passing below the critical temperature of the fluid.

10. The process of claim 8 wherein said step of expanding said volume further comprises expanding said volume sufficiently to lower the density while maintaining said fluid in the vapor state.

11. The process of claim 8 wherein said step of expanding said volume further comprises expanding said volume sufficiently to lower the density without precipitating said uniform and homogeneous mixture while more than one phase is present in said fluid.

* * * * *